United States Patent [19]

Kimura et al.

[11] Patent Number: 5,199,080
[45] Date of Patent: Mar. 30, 1993

[54] VOICE-OPERATED REMOTE CONTROL SYSTEM

[75] Inventors: Toshiyuki Kimura; Kazuo Yabe, both of Kawagoe, Japan

[73] Assignee: Pioneer Electronic Corporation, Tokyo, Japan

[21] Appl. No.: 578,706

[22] Filed: Sep. 7, 1990

[30] Foreign Application Priority Data

Dec. 29, 1989 [JP] Japan .................. 1-341629

[51] Int. Cl.⁵ ............................... H03G 3/20
[52] U.S. Cl. ......................... 381/110; 381/43
[58] Field of Search ............ 381/110, 42, 43, 41; 395/2

[56] References Cited

U.S. PATENT DOCUMENTS

| | | | |
|---|---|---|---|
| 4,718,093 | 1/1988 | Brown | 381/42 |
| 4,725,956 | 2/1988 | Jenkins | 381/110 |
| 4,837,830 | 6/1989 | Wrench, Jr. et al. | 381/42 |
| 4,922,538 | 5/1990 | Tchorzewsm | 381/43 |

FOREIGN PATENT DOCUMENTS 0178699  7/1990  Japan ..................... 381/42

Primary Examiner—Forester W. Isen
Attorney, Agent, or Firm—Sughrue, Mion, Zinn, Macpeak & Seas

[57] ABSTRACT

A voice-operated remote control system which transmits a remote control signal in response to a voice command has a speech recognition circuit for recognizing the voice command. The speech recognition circuit has standard pattern data storage unit for storing a plurality of standard pattern data with respect to each of voice commands. The input voice command is compared with the plural standard pattern data for accurate speech recognition.

5 Claims, 10 Drawing Sheets

VOICE-OPERATED REMOTE CONTROL SYSTEM

BACKGROUND OF THE INVENTION

The present invention relates to a remote control system for remotely controlling various electronic devices, and more particularly to a remote control system for remotely controlling devices such as AV (audio visual) devices by way of voice commands.

In recent years, various AV devices such as stereo sets, television receivers, cassette tape decks, video tape decks, compact disk players, laser vision disk players, or the like are equipped with remote control systems.

A remote control system has a transmitter which is usually positioned remotely from a controlled AV device. The transmitter, when operated, transmits a remote control signal, such as an infrared remote control signal, which is received by a receiver in the controlled AV device. The received remote control signal is decoded to control the AV device as intended by the remote control signal.

There has recently been developed a voice-operated remote control system which employs voice control commands instead of control commands entered through keys. The voice-operated remote control system has a microphone mounted on a transmitter for converting a voice command into an electric voice signal, and a speech recognition LSI (Large Scale Integration) circuit for generating a remote control signal which corresponds to a voice pattern represented by the voice signal. The remote control signal thus generated is transmitted to a receiver in a controlled AV device.

In conventional voice-operated remote control system, standard pattern data corresponding to voice commands given by the operator are registered in advance. When a voice command is applied for remote control, the input voice command is recognized on the basis of the registered standard pattern data.

The voice sound uttered by the operator may not necessarily be the same at all times. Features of the voice sound of the operator may sometimes vary from those at the time the operator's standard pattern data were registered. If the voice sound features vary, then pattern data of an input voice command do not coincide with the standard pattern data, and the speech recognition rate is lowered.

In order to avoid the above drawback, it is necessary to register the standard pattern data again at a suitable time. However, the process of registering the standard pattern data again is tedious and time-consuming, and makes the remote control system inconvenient to use.

SUMMARY OF THE INVENTION

It is an object of the present invention to provide a voice-operated remote control system which has an increased speech recognition rate even if voice sound features of the operator vary with time.

According to a first aspect of the present invention, there is provided a voice-operated remote control system comprising a microphone for converting a voice command into an electric signal, speech recognition means for converting the electric signal into pattern data and comparing the pattern data with registered standard pattern data to produce command data corresponding to the voice command, and transmitting means for generating and transmitting a remote control signal based on the command data, the speech recognition means comprising a plurality of standard pattern storage areas for storing a plurality of different standard pattern data for each of command data, and means for recognizing the voice command based on the plurality of different standard pattern data.

When a voice command is entered through the microphone, the speech recognition means converts the contents of the voice command into pattern data and compares the pattern data with a plurality of different standard pattern data which have been registered in the standard pattern data storage areas. Then, the speech recognition means applies a remote control instruction signal to the transmitting means to produce a remote control signal.

According to a second aspect of the present invention, there is provided a voice-operated remote control system comprising a microphone for converting a voice command into an electric signal, speech recognition means for converting the electric signal into pattern data and comparing the pattern data with registered standard pattern data to produce command data corresponding to the voice command, and transmitting means for generating and transmitting a remote control signal based on the command data, the speech recognition means comprising a plurality of parallel speech recognition processors for independently recognizing the voice command based on respective standard pattern data and outputting respective recognition results.

When a voice command is entered through the microphone, the voice command is recognized by the speech recognition processors independently based on their standard pattern data, and the speech recognition processors output their respective recognition results. Based on the recognition results of the speech recognition processors, the speech recognition means applies a remote control instruction signal to the transmitting means to produce a remote control signal.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIGS. 8(*b*) through 8(*f*) are diagrams showing the waveforms of signals in the analog processor shown in FIG. 8(*a*), respectively;

DETAILED DESCRIPTION OF THE INVENTION

General Remote Control System

For a better understanding of the present invention, a general remote control system and a voice remote control signal will first be described below.

Figure 1:
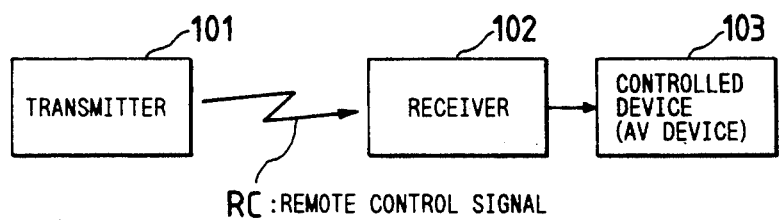
FIG. 1 is a block diagram of a general remote control system.

As shown in FIG. 1, a remote control system 100 comprises a transmitter 101 for transmitting a remote control signal from a position remote from a controlled device 103 such as an AV device, and a receiver 102 for receiving the transmitted remote control signal, decoding the remote control signal, and sending the decoded information to the controlled device 103.

Figure 2:
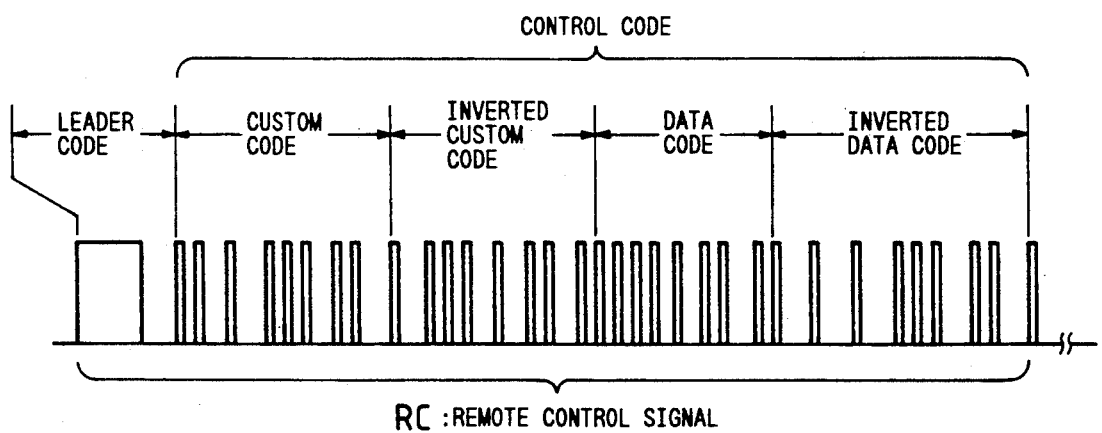
FIG. 2 is a diagram showing a remote control signal by way of example.

FIG. 2 shows a general remote control signal. The remote control signal is composed of a leader code which informs a receiver of the transmission of data, a custom code and an inverted custom code which indicate a controlled device, a data code and an inverted data code which indicate a control command for the controlled device. The inverted custom code and the inverted data code are used to detect any error in the custom code and the data code, respectively.

Figure 3:
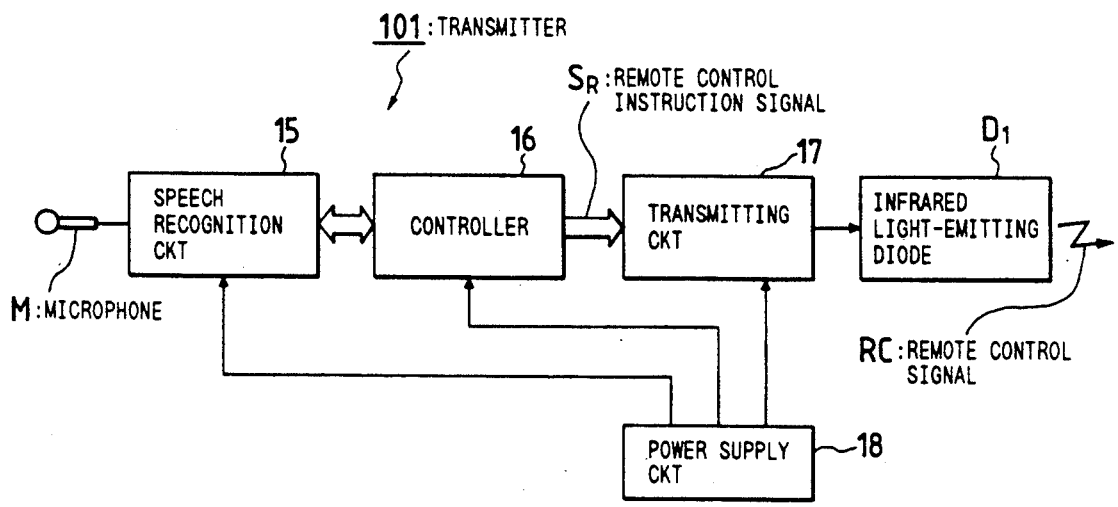
FIG. 3 is a block diagram of the transmitter of a general voice-operated remote control system.

FIG. 3 schematically shows the transmitter 101 of the voice-operated remote control system 100. The transmitter 101 has a microphone M for converting a voice command into an electric signal. The converted electric signal is applied to a speech recognition circuit 15 in the form of a speech recognition LSI circuit or the like which includes a microprocessor. The speech recognition circuit 15 recognizes the contents of the applied electric signal, and produces command data corresponding to the recognized contents. The transmitter 101 also has a controller 16 comprising a microprocessor. Based on the command data from the speech recognition circuit 15, the controller 16 produces and applies a remote control instruction signal SR to a transmitting circuit 17, which then energizes an infrared light-emitting diode D1 to transmit a remote control signal RC. The above components of the transmitter 101 are supplied with electric energy from a power supply circuit 18.

When a voice command is received through the microphone M, the speech recognition circuit 15 converts the voice command into pattern data. The speech recognition circuit 15 compares the voice command pattern data with a plurality of standard pattern data which are stored therein, determines the distance between the voice command data and the standard pattern data, and outputs command data corresponding to the standard pattern data whose distance which from the voice command pattern data is smallest. There may also be employed another speech recognition process in which the similarity of the compared pattern data is determined according to a known simple similarity method and command data corresponding to the standard pattern data which has the highest similarity are outputted. The command data thus produced are applied to the controller 16.

The controller 16 sends a remote control signal SR corresponding to the applied command data to the transmitting circuit 17. In response to the supplied remote control instruction signal SR, the transmitting circuit 17 drives the infrared light-emitting diode D1 to transmit a remote control signal RC. The controlled device 103 is therefore remotely controlled by the remote control signal RC.

First Embodiment

A voice-operated remote control system according to a first embodiment of the present invention will now be described below with reference to FIGS. 4 through 10.

External Structure

Figure 4:
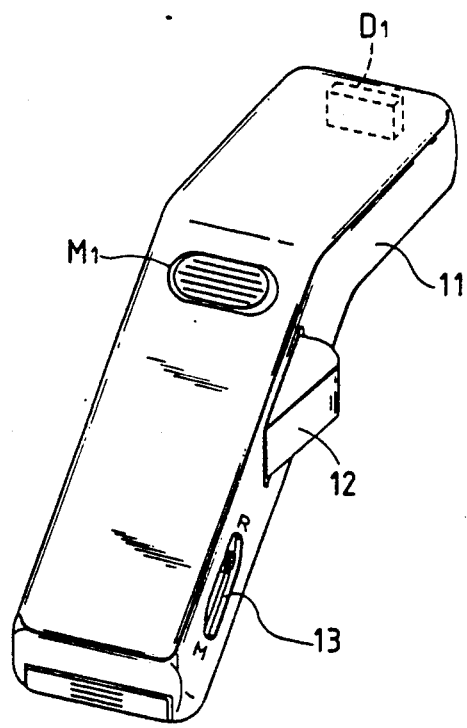
FIG. 4 is a perspective view of the transmitter of a voice-operated remote control system according to a first embodiment of the present invention.

As shown in FIG. 4, a transmitter 10A of the voice-operated remote control system has a unitary casing 11 which allows the operator to carry the transmitter freely around. The casing 11 supports a microphone M on an upper panel thereof. The microphone M converts a voice command given by the operator into an electric signal. An infrared light-emitting diode D1, for example, is mounted in one end of the casing 11. The infrared light-emitting diode D1 is used to transmit a remote control signal to the receiver of a remotely controlled device (not shown). On one side of the casing 11, there is disposed a voice input switch (hereinafter referred to as a "talk switch") 12 which is closed when pressed and can automatically be released or opened when released. The talk switch 12 may be an automatic-return pushbutton switch or a slide-type switch. When a voice command is to be entered, the talk switch 12 is closed to operate the transmitter 10A. Otherwise, the talk switch 12 is open keeping the transmitter 10A out of operation. The casing 11 also supports, on its side, a mode selector switch 13 in the form of a slide-type switch, for example. The mode selector switch 13 serves to select one of the following modes at a time. The modes include a speech registration mode in which a voice command is registered in the transmitter 10A and a speech recognition mode in which a voice command is recognized, as described later on. The casing 11 accommodates therein an electronic circuit of the voice-operated remote control system according to the present invention.

Electronic Circuit Structure

Figure 5:
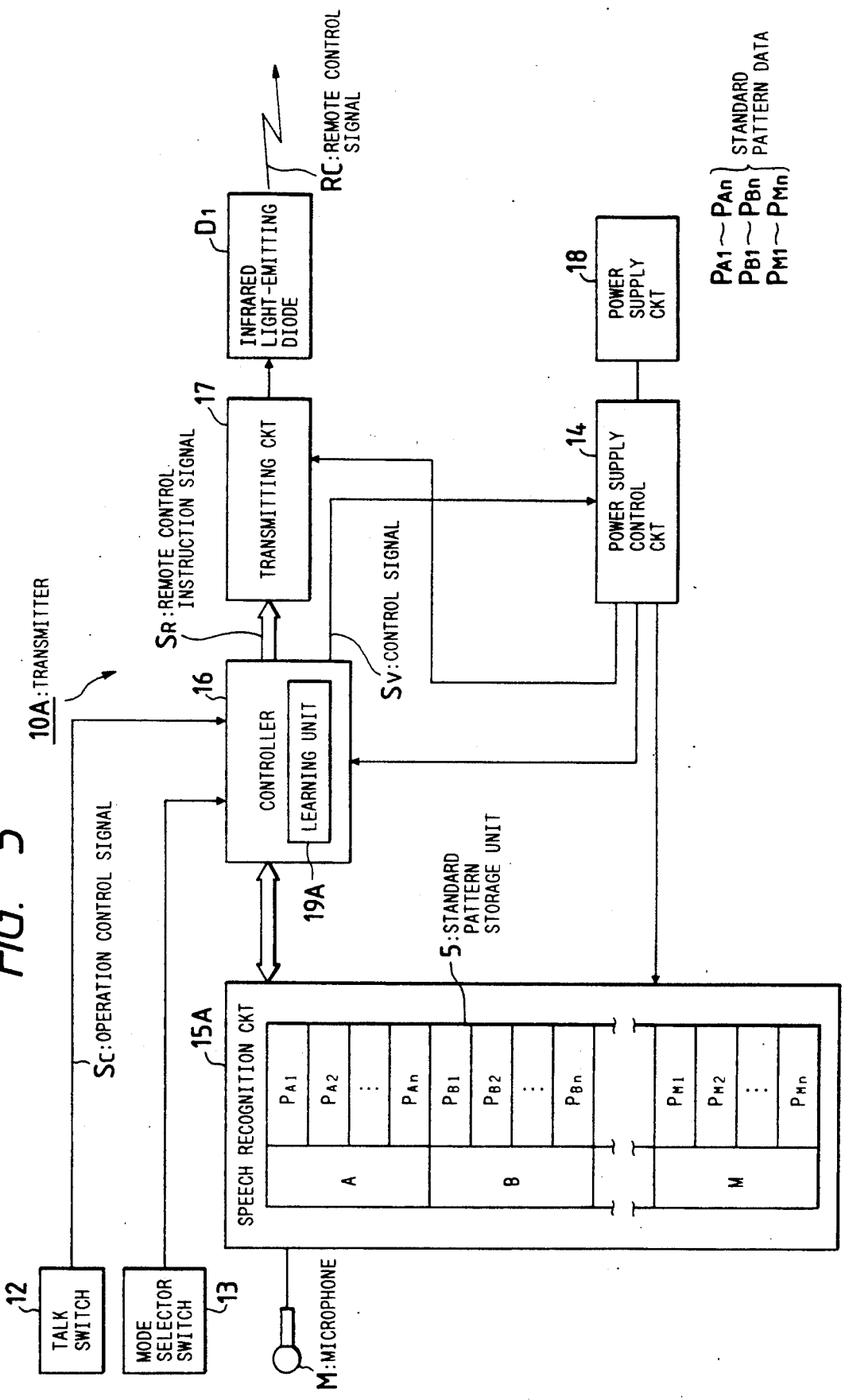
FIG. 5 is a block diagram of the transmitter of the voice-operated remote control system according to the first embodiment.

FIG. 5 shows in block form the electronic circuit of the transmitter 10A of the voice-operated remote control system according to the present invention. The transmitter 10A has a speech recognition circuit 15A including a standard pattern data storage unit 5 which stores a plurality of different standard pattern data with respect to each of the voice commands. For example, the standard pattern data storage unit 5 stores standard pattern data PA1 through PAn with respect to a voice command A and standard pattern data PB1 through PBn with respect to a voice command B. Further, thus, standard pattern data PM1 through PMn with respect to a voice command M are stored therein. One voice command which is entered from the microphone M is recognized using a plurality of standard pattern data, and the recognized data are converted into a remote control signal RC. The transmitter 10A has a controller 16 to which the talk switch 12 and the mode selector switch 13 are connected. The controller 16 applies a remote control instruction signal SR to a transmitting circuit 17 which energizes the infrared light-emitting diode D1 to transmit a remote control signal RC to the receiver of a remotely controlled device. The speech recognition circuit 15A, the controller 16, and the transmitting circuit 17 are supplied with electric energy from a power supply circuit 18 through a power supply control circuit 14 and power supply wires.

Figure 6:
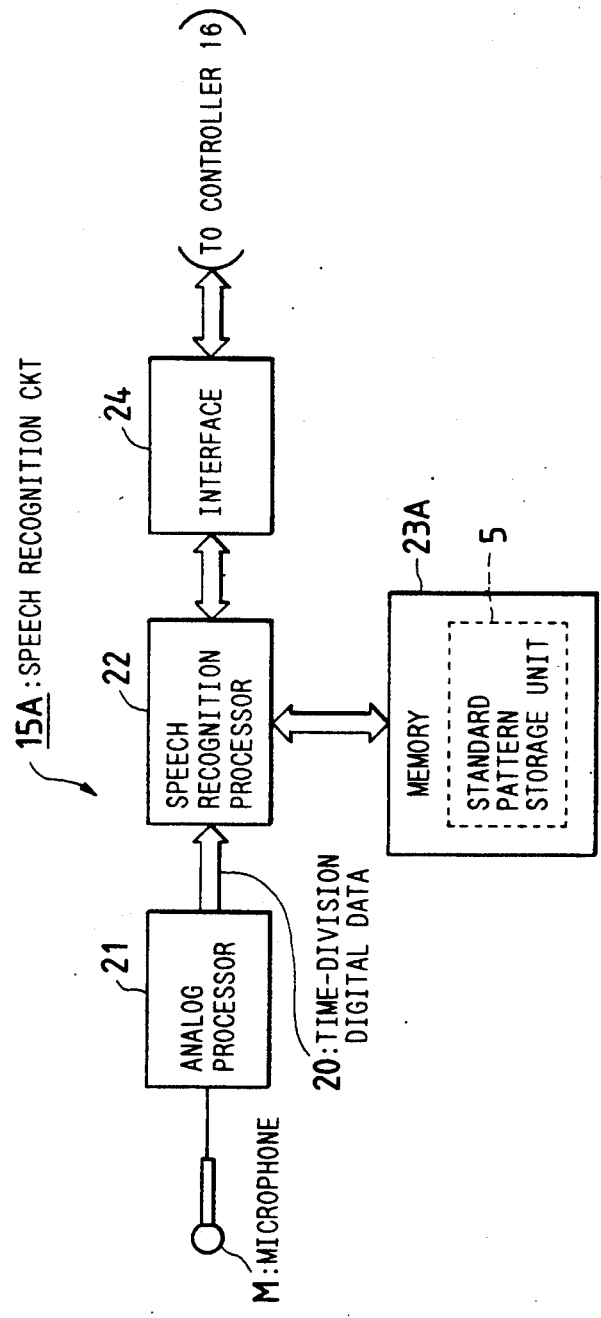
FIG. 6 is a block diagram of a speech recognition circuit according to the first embodiment.

As shown in FIG. 6, the speech recognition circuit 15A comprises an analog processor 21 for processing an analog voice command signal which is received through the microphone M and for outputting the processed analog voice command signal as a time-division digital data 20, a speech recognition processor 22 for recognizing the voice command based on the time-division digital data 20 from the analog processor 21, a memory 23A for storing standard pattern data for speech recognition, and an interface 24 for transmitting signals to and receiving signals from the controller 16.

The memory 23A serves as the standard pattern data storage unit 5 shown in FIG. 5, and stores a plurality of different standard pattern data PA1 through PAn, PB1 through PBn , . . . , PM1 through PMn with respect to respective voice commands.

Figure 7:
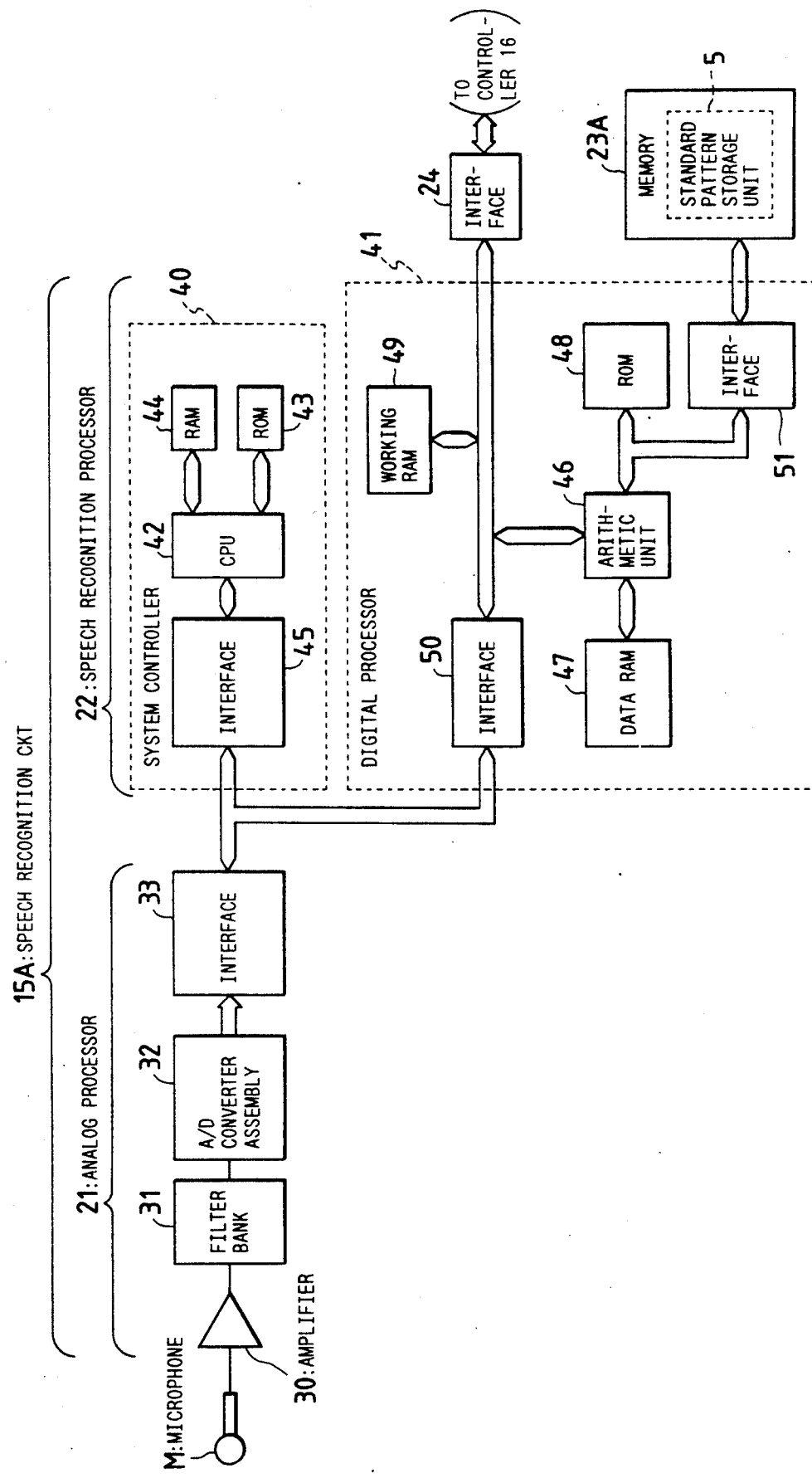
FIG. 7 is a detailed block diagram of the speech recognition circuit according to the first embodiment.

As shown in FIG. 7, the analog processor 21 generally comprises an amplifier 30 for amplifying a voice command signal transmitted from the microphone M to a suitable level, a filter bank 31 for dividing an amplifier output signal into signals in different frequency bands and rectifying and outputting the signals in these different frequency bands, an analog-to-digital converter assembly (hereinafter referred to as an "A/D converter assembly") 32 for converting the output signals in the different frequency bands from the filter bank 31 into digital signals, and an interface 33 for transmitting signals to and receiving signals from the speech recognition processor 22.

Figure 8A:
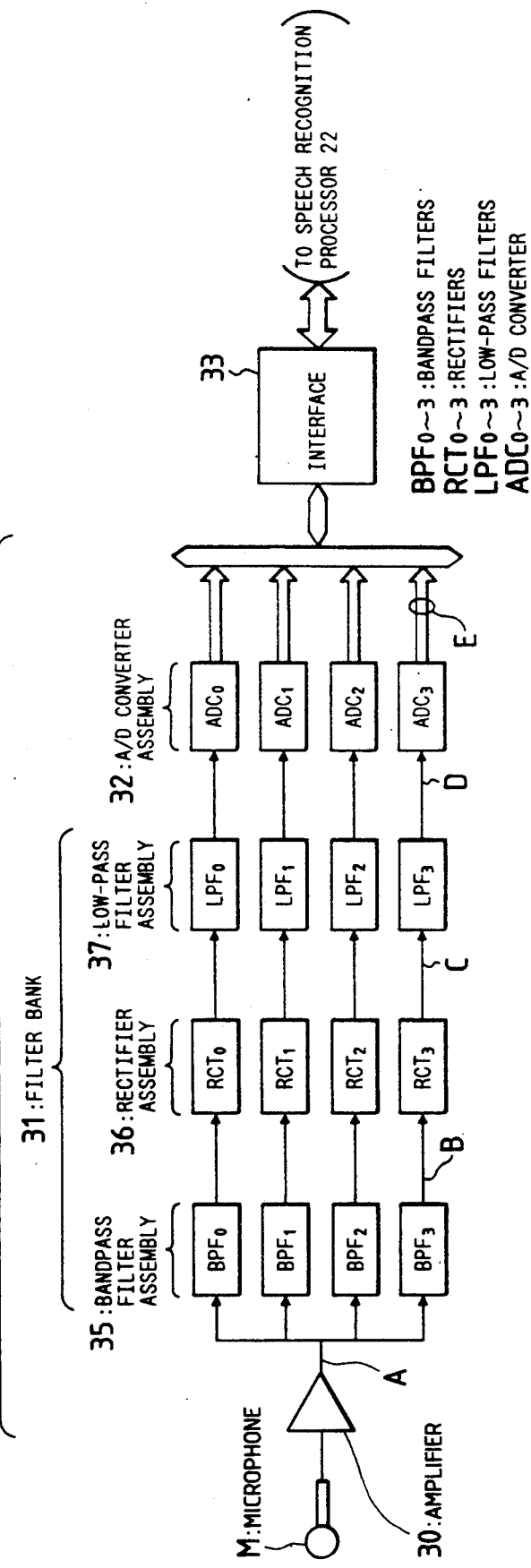
FIG. 8(*a*) is a diagram showing an analog processor.

As shown in FIG. 8(a), the filter bank 31 comprises a bandpass filter assembly 35 for dividing the input voice signal into signals in a plurality of frequency bands (four frequency bands in FIG. 8(a)), a rectifier assembly 36 for rectifying output signals from the bandpass filter assembly 35, and a low-pass filter assembly 37 for removing ripples from output signals from the rectifier assembly 36.

The bandpass filter assembly 35 comprises a plurality of (four in FIG. 8(a)) bandpass filters BPF0 through BPF3 which have respective central frequencies f0, f1, f2, f3 (f0<f1<f2<f3) corresponding to the frequency bands.

The rectifier assembly 36 comprises four rectifiers RCT0 through RCT3 connected in series with the bandpass filters BPF0 through BPF3 of the bandpass filter assembly 35, respectively. The rectifiers RCT0 through RCT3 rectify the output signals from the bandpass filters BPF0 through BPF3 in the respective frequency bands.

The low-pass filter assembly comprises four low-pass filters LPF0 through LPF3 connected in series with the rectifiers RCT0 through RCT3 of the rectifier 36, respectively. The low-pass filters LPF0 through LPF3 remove ripples from the rectified signals in the respective frequency bands.

The A/D converter assembly 32 comprises four A/D converters ADC0 through ADC3 connected in series with the low-pass filters LPF0 through LPF3 of the low-pass filter assembly 37, respectively. The A/D converters ADC0 through ADC3 convert the analog output signals from the low-pass filters LPF0 through LPF3 into respective digital signals.

Operation of the analog processor 21 will be described below. For the sake of brevity, only signal processing in one frequency band (e.g., through the bandpass filter BPF3) will be described. However, similar signal processing is carried out in the other frequency bands.

Figure 8F:
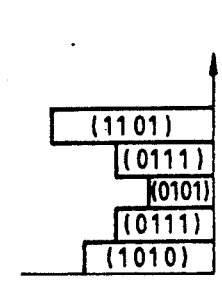
Figure 8E:
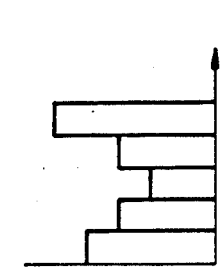
Figure 8D:
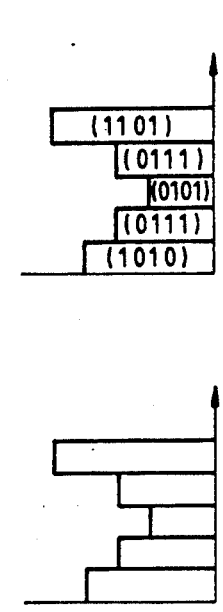
Figure 8C:
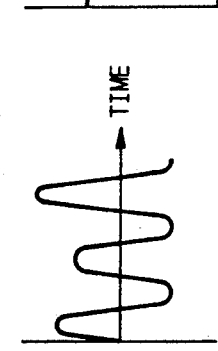
Figure 8B:
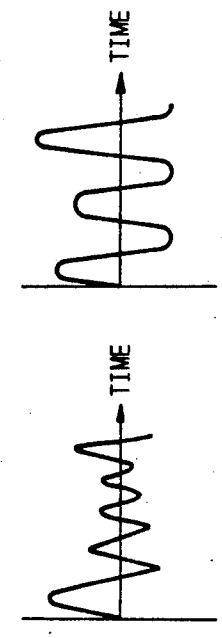

When a voice command is applied to the microphone M, the output electric signal from the microphone M is amplified to a suitable signal level by the amplifier 30, which outputs an amplified signal A (see FIG. 8(b)). The amplified signal A is applied to the bandpass filter BPF3, which then passes only a signal B in its passband. The signal B is then applied to the rectifier RCT3 (see FIG. 8(c)). The signal B is rectified by the rectifier RCT3, and a rectified output signal C (FIG. 8(d)) from the rectifier RCT3 is transmitted to the low-pass filter LPF3. The low-pass filter LPF3 removes ripples which may be contained in the signal C, and produces a ripple-free output signal D (see FIG. 8(e)) which is then inputted to the A/D converter ADC3. The A/D converter ADC3 then converts the supplied input signal D into a signal E composed of 4-bit time-division digital data (1010), (0111), (0101), (0111), (1101), . . . , as shown in FIG. 8(f).

As illustrated in FIG. 7, the speech recognition processor 22 comprises a system controller 40 for analyzing and processing control commands from the controller 16 and also for controlling the entire operation of the speech recognition processor 22, and a digital processor 41 for effecting distance calculations and controlling the memory 23A.

The system controller 40 comprises a CPU (Central Processing Unit) 42 for controlling the overall operation of the transmitter 1, a ROM (Read-Only Memory) 43 for storing a control program to be executed by the CPU 42 for the overall operation of the transmitter 1, a RAM (Random-Access Memory) 44 for temporarily storing data, and an interface 45 for transmitting data to and receiving data from the analog processor 21 and the digital processor 41.

The digital processor 41 comprises an arithmetic unit 46 for effecting distance calculations and identifying input voice commands based on the results of the distance calculations, a data RAM 47 for storing data necessary for distance calculations, a ROM 48 for storing a program for distance calculations, a working RAM 49 for temporarily storing processed data, an interface 50 for transmitting data to and receiving data from the analog processor 21 and the system controller 40, and an interface 51 for transmitting data to and receiving data from the memory 23A.

The speech recognition processor 22 operates as follows: When a control command is applied from the controller 16 through the interface 24 to the speech recognition processor 22, the system controller 40 receives the control command through the interfaces 50, 45 and analyzes the received control command. If the result of analysis indicates a speech recognition process, the system controller 40 sends an instruction for speech recognition to the digital processor 41 through the interfaces 45, 50.

When instructed by the system controller 40, the digital processor 41 introduces time-division digital data (input voice command signal) 20 from the analog processor 21 through the interface 50 into the data RAM 47. The arithmetic unit 46 reads the standard pattern data from the first address in the memory 23A which stores the different standard pattern data PA1 through PAn, PB1 through PBn, . . . PM1 through PMn, through the interface 51. Then, the arithmetic unit 46 determines the logarithm of the first time-division digital data of a plurality of time-division digital data which constitute one of the read standard pattern data and also the logarithm of the first time-division digital data of the input voice command signal, and then determines the differences between the two logarithms. The arithmetic unit 46 further squares the differences, and adds the squares to determine a distance D. Therefore, the distance D is given by:

$$D = \sum_{t=0}^{x} (\log(f(t)) - \log(fs(t)))^2$$

where
- x: the number of time divisions;
- f(t): the input voice command data (time-division digital data); and
- fs(t): the standard pattern data (time-division digital data).

Likewise, the distances D are calculated in the same manner for all the standard pattern data. The smaller the calculated distances, the higher the probability that the standard pattern data are similar to the voice command. The recognition results thus obtained are collected for each of voice commands. Then, command data corresponding to the voice command to which the standard pattern data are most similar as a whole are outputted as command data from the speech recognition circuit 15A through the interface 24 to the controller 16.

Referring back to FIG. 5, the controller 16 is in the form of a microprocessor, for example. The microprocessor of the controller 16 comprises a CPU, a ROM, a RAM, and an interface. The CPU executed arithmetic operations while referring to data stored in the RAM, which serves as a working memory, according to the algorithm (see FIG. 9) of a control program stored in the ROM, for thereby effecting the overall operation of the transmitter 10A. The controller 16 also receives signals from the talk switch 12 and the mode selector switch 13 as interrupt signals, and effects control functions according to commands indicated by these interrupt signals. Operation of the transmitter 10A under the control of the controller 16 will be described below.

The controller 16 has a learning unit 19A. The learning unit 19A may be hardware-implemented by an independent electric circuit. In the illustrated embodiment, however, the learning unit 19A is software-implemented according to a learning program which is either stored in a memory that stores a control program for the controller 16 or included in the control program for the controller 16. Specifically, the learning unit 19A is implemented by steps S17, S18 in FIG. 9.

If one of a plurality of different standard pattern data corresponding to the recognition result, as a whole, of the speech recognition circuit 15A is different from the recognition result, as a whole, of the speech recognition circuit 15A, then that standard pattern data item is automatically updated or replaced with the pattern data of the input voice command. For example, in the case where an input voice command is recognized as a voice command A by the recognition result, as a whole, of the speech recognition circuit 15A, if the recognition result using one PA2 of a plurality of different standard pattern data PA1 through PAn with respect to the voice command A indicates that the input voice command is not the voice command A, that is, if the distance between the input voice command and the data PA2 is too large, then the standard pattern data item PA2 is updated or replaced with the pattern data of the input voice command.

Overall Operation

The transmitter 10A operates depending on whether the talk switch 12 is pressed or released (i.e., turned on or off). If the talk switch 12 is pressed, the transmitter 10A is capable of transmitting remote control signals, and if the talk switch 12 is released, the transmitter 10A is kept in the low power consumption mode, waiting for voice commands to be applied. There are two input modes for entering voice commands. In one input mode, voice commands of the operator are registered, and in the other input mode, voice commands of the operator are recognized. In the voice registration mode, a command word such as for "reproduction" is recorded in the transmitter 10A.

Figure 9:
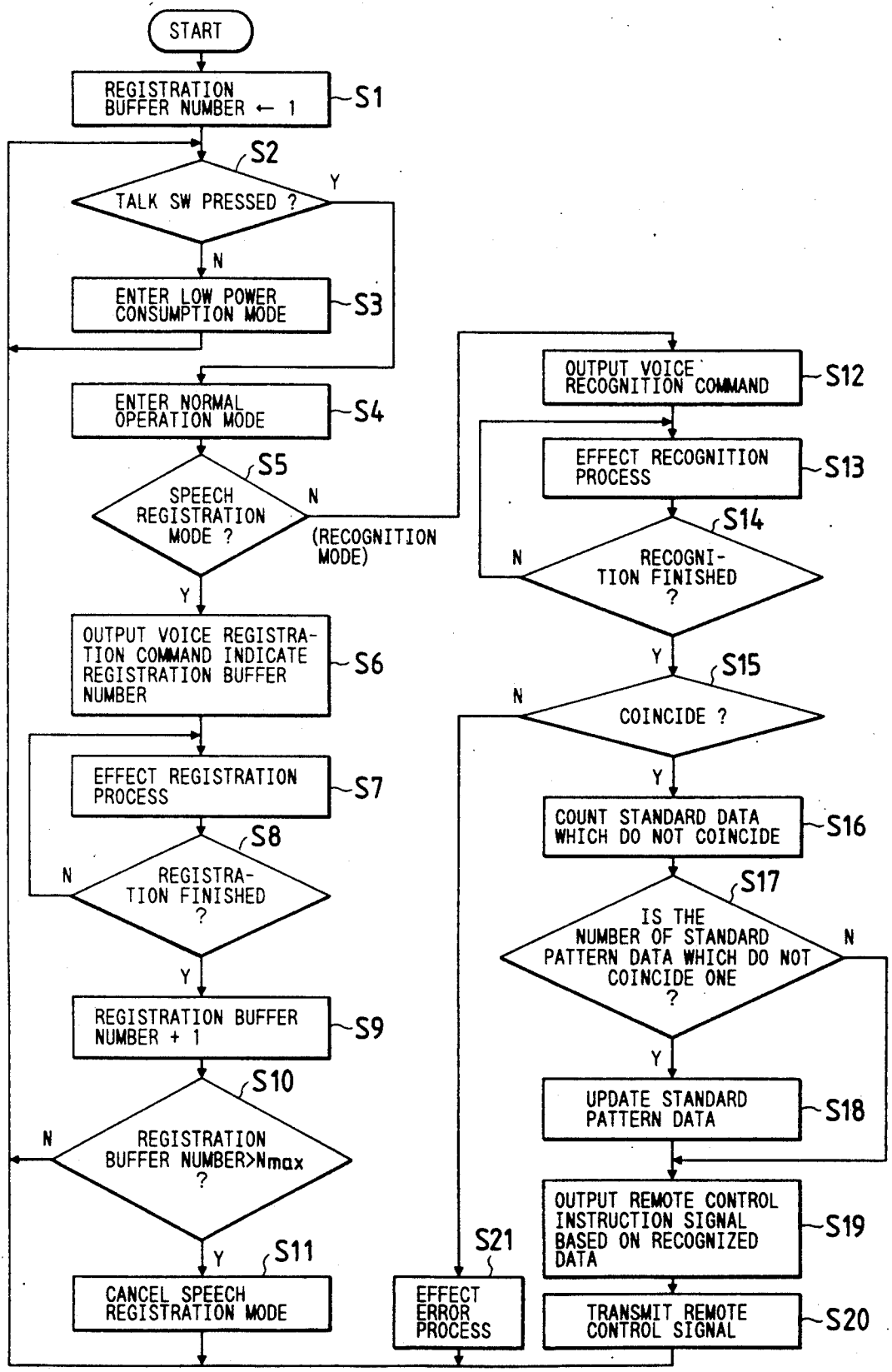
FIG. 9 is a flowchart of an operation sequence of the transmitter according to the first embodiment.

Now, operation of the transmitter 10A will be described below with reference to the flowchart of FIG. 9. It is assumed that the talk switch 12 is not pressed and the transmitter 10A is in a standby condition in the low power consumption mode.

First, the controller 16 initializes a registration buffer number to 1 in a step S1.

Then, the controller 16 detects whether the talk switch 12 is pressed or not in a step S2 by detecting whether there is produced an operation control signal Sc from the talk switch 12 or not. If an operation control switch Sc is produced at this time, then it means that the talk switch 12 is pressed, and the controller 16 sends a control signal Sv to the power supply control circuit 14. The power supply control circuit 14 supplies electric energy in a normal mode, enabling the transmitter 10A in a step S4.

If the talk switch 12 is not pressed, the transmitter 1 is left in the low power consumption mode, and the steps S2 and S3 are repeated.

Thereafter, the controller 16 reads the condition of the mode selector switch 13 to determine whether or not it indicates the speech registration mode for voice commands to generate standard pattern data, in a step S5.

If the speech registration mode is indicated, control then goes to a step S6 in which the controller 16 outputs a command to instruct the speech recognition circuit 15A to carry out a speech registration process. At the same time, the controller 16 sends a registration buffer number to the speech recognition circuit 15A in the step S6.

The speech recognition circuit 15A then stores speech recognition standard pattern data in a corresponding registration buffer in the memory 23A, i.e., a registration buffer having the registration buffer number = 1, in a step S7.

The controller 16 reads a status register (not shown) in the speech recognition circuit 15A to determine whether or not the registration of a voice command is finished in a step S8. If the registration is not yet finished, then the steps S7 and S8 are repeated until the registration is finished. If the registration is finished, the registration buffer number is incremented by 1 in a step S9.

Then, the controller 16 determines whether or not the current registration buffer number has exceeded a maximum number Nmax that can be registered in a step S10. If not, then control returns to the step S2. If exceeded, the controller 16 sends a command to cancel the speech registration mode to the speech recognition circuit 15A, thereby canceling the speech registration mode in a step S11. Then, control goes back to the step S2.

If the speech registration mode is not indicated by the mode selector switch 13 in the step S5, i.e., if the speech recognition mode is indicated by the mode selector switch 13 in the step S5, then the controller 16 outputs a speech recognition command to the speech recognition circuit 15A in a step S12. The speech recognition circuit 15A now effects a speech recognition process as described above in a step S13.

The controller 16 reads a status register (not shown) in the speech recognition circuit 15A to determine whether or not the speech recognition is finished in a step S14. If the speech recognition is not yet finished, then the steps S13 and S14 are repeated until the speech recognition is finished. If the speech recognition is finished, then the controller 16 determines whether the input voice command data and the standard pattern data coincide with each other, i.e., the distance D falls within a predetermined distance, or not in a step S15. If the input voice command data and the standard pattern data coincide with each other, then the learning unit 19A counts the number of standard pattern data which do not agree with the recognition result, among all the standard pattern data corresponding to the recognition result, in a step S16. Then, the learning unit 19A determines whether the number of standard pattern data which disagree with the recognition result is 1 or not in a step S17. If the number is 1, then the learning unit 19A updates or replaces that standard pattern data item with the pattern data of the input voice command in a step S18. If the number is more than 1, then control jumps to a step S19. Since particular standard pattern data can automatically be updated by the learning unit 19A, the speech recognition rate can be maintained at a high level over a long period of time.

Thereafter, the controller 16 produces a remote control instruction signal SR based on the recognized voice command data and sends the remote control instruction signal SR to the transmitting circuit 17 in the step S19. In response to the remote control instruction signal SR, the transmitting circuit 17 transmits a corresponding remote control signal RC in a step S20. If the input voice command data and the standard pattern data do not coincide with each other in the step S15, then the controller 16 effects an error process such as the generation of a buzzer sound in a step S21, and control goes back to the step S2.

In the first embodiment of the present invention, as described above, since one voice command is recognized using a plurality of different standard pattern data PA1 through PAn, PB1 through PBn, ... PM1 through PMn for respective voice commands, such a voice command can accurately be recognized even if it has slightly varied with time. If one of different standard pattern data with respect to one voice command indicates a different recognition result, then that standard pattern data item is updated or replaced with the pattern data of the input voice command by the learning unit 19A. Therefore, a time-dependent change in voice commands can also be recognized without error.

Since one voice command is recognized using a plurality of different pattern data, the speech recognition rate of the voice-operated remote control system is increased.

Second Embodiment

A voice-operated remote control system according to a second embodiment of the present invention will be described below with reference to FIGS. 10 through 12.

External Structure

The voice-operated remote control system according to the second embodiment has a transmitter which has the same external structure as that of the transmitter 10A shown in FIG. 4.

Electronic Circuit Structure

Figure 10:
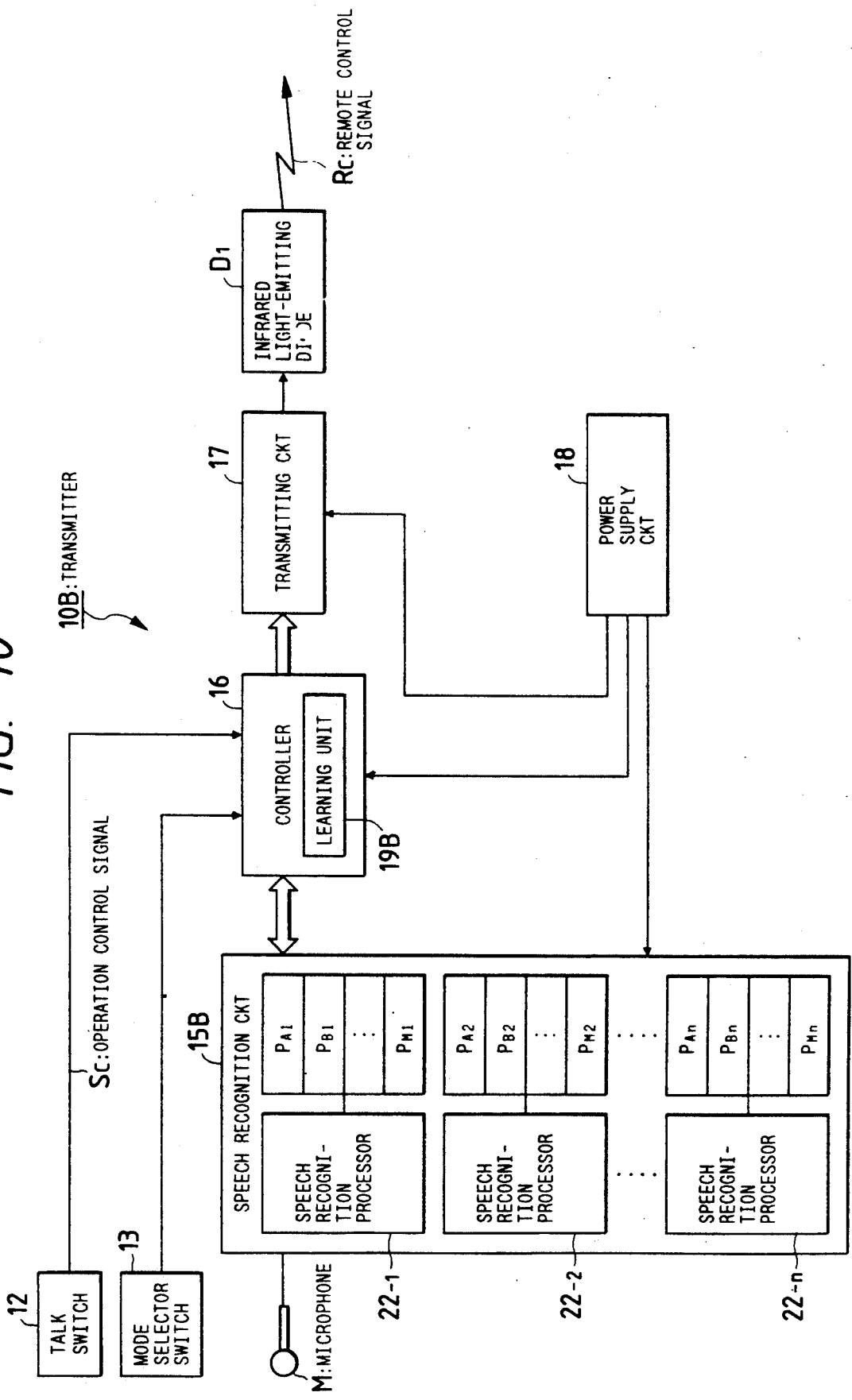
FIG. 10 is a block diagram of the transmitter of a voice-operated remote control system according to a second embodiment of the present invention.
Figure 11:
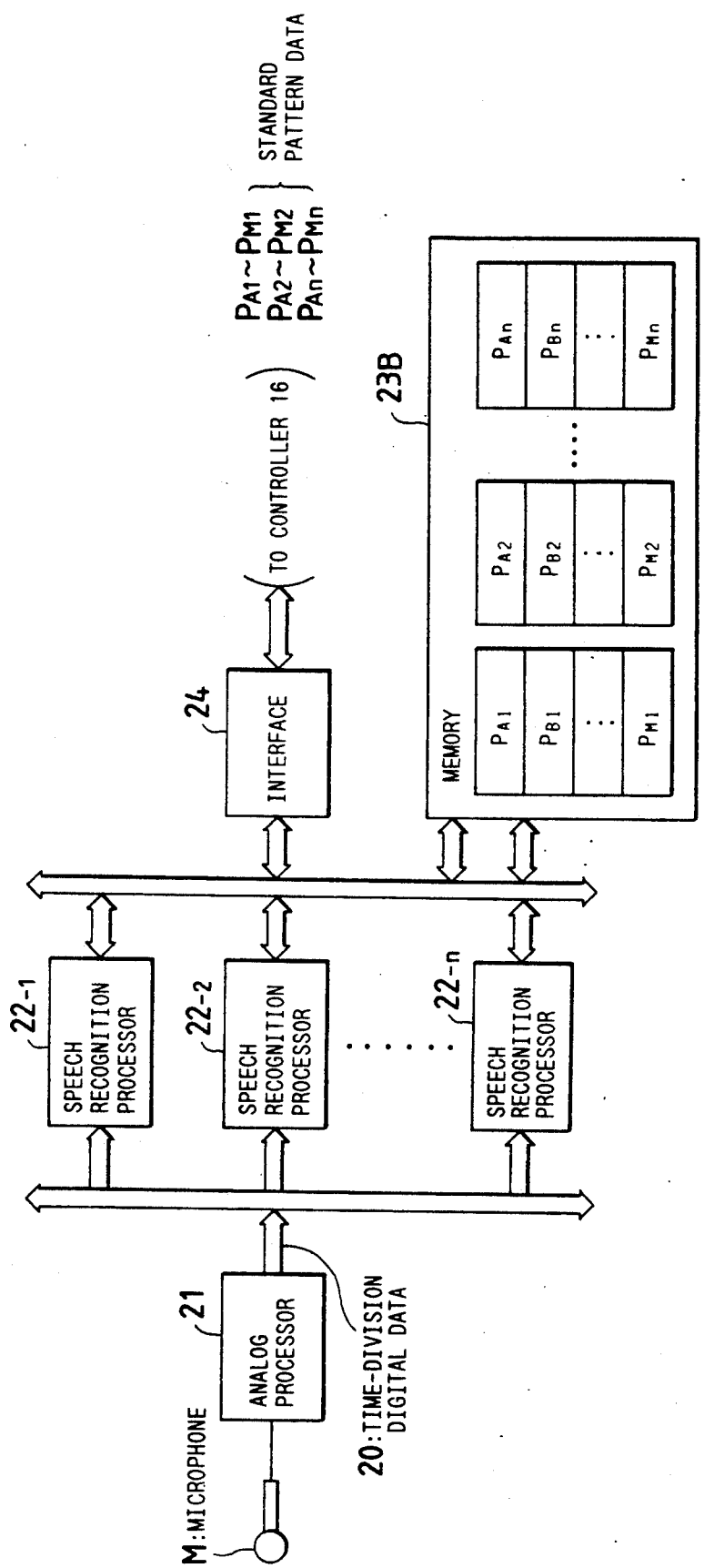
FIG. 11 is a block diagram of a speech recognition circuit according to the second embodiment.

The transmitter, generally indicated at 10B, of the voice-operated remote control system according to the second embodiment is shown in FIGS. 10 and 11. Those parts shown in FIG. 10 which are identical to those shown in FIG. 5 are denoted by identical reference numerals, and will not be described in detail.

The transmitter 10B has a speech recognition circuit 15B which, as shown in FIG. 11, comprises an analog processor 21 for processing an analog voice command signal which is received through the microphone M and outputting the processed analog voice command signal as a time-division digital data 20, a plurality of parallel speech recognition processors 22-1 through 22-n for independently recognizing the voice command based on the time-division digital data 20 from the analog processor 21, a memory 23B for storing standard pattern data for speech recognition by the speech recognition processors 22-1 through 22-n, respectively, and an interface 24 for transmitting signals to and receiving signals from a controller 16.

The speech recognition processors 22-1 through 22-n use respective standard pattern data with respect to each voice command, and effect independent speech recognition processes. For example, the speech recognition processor 22-1 uses standard pattern data Pa1, Pb1, ... PM1, and the speech recognition processor 22-2 uses standard pattern data PA2, PB2, ... PM2.

The memory 23B has address areas allotted to the respective speech recognition processors 22-1 through 22-n, and stores standard pattern data PA1 through PM1, PA2 through PM2, ..., PAn through PMn.

These standard pattern data may be stored in different areas in the memory 23B as described above, or may be stored in respective memories associated with the respective speech recognition processors.

The other structural details of the speech recognition circuit 15B, i.e., the analog processor 21 and the interface 24, are the same as those shown in FIGS. 6, 7, and 8.

As shown in FIG. 10, the controller 16 comprises a microprocessor and has a learning unit 19B. The learning unit 19B is software-implemented by a learning program which is nested with a control program for the transmitter 10B. Specifically, the learning unit 19B is implemented by steps S49, S50 in FIG. 12.

When one of the speech recognition processors 22-1 through 22-n outputs a recognition result with respect to a voice command, which result is different from that of another speech recognition processor, the standard pattern data corresponding to the voice command and used by said one speech recognition processor are updated or replaced with the pattern data of the voice command by the learning unit

Overall Operation

The transmitter 10B according to the second embodiment operates as follows: It is assumed that the talk switch 12 is not pressed and the transmitter 10B is in a standby condition.

Figure 12:
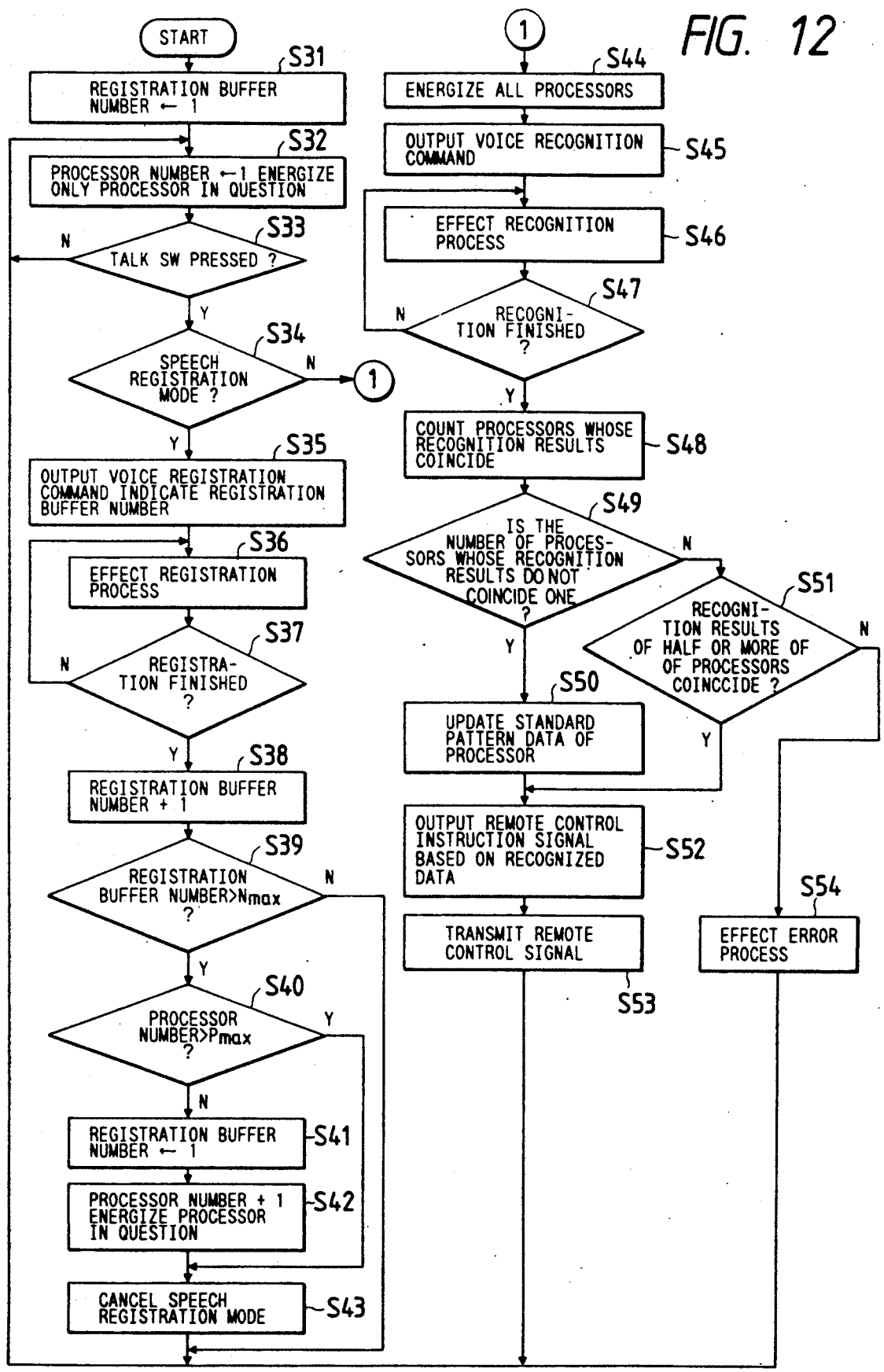
FIG. 12 is a flowchart of an operation sequence of the transmitter according to the second embodiment.

First, the controller 16 initializes a registration buffer number to 1 in a step S31 (FIG. 12). The processor number is initialized to 1, and the speech recognition processor corresponding to that processor number, e.g., the speech recognition processor 22-1, is enabled in a step S32.

Then, the controller 16 detects whether the talk switch 12 is pressed or not in a step S33 by detecting whether there is produced an operation control signal Sc from the talk switch 12 or not. If an operation control switch Sc is produced at this time, then it means that the talk switch 12 is pressed, and the controller 16 enables the transmitter 10B to receive a voice command.

If the talk switch 12 is not pressed, the transmitter 1 is left in the standby condition, and the steps S32 and S33 are repeated.

Thereafter, the controller 16 reads the condition of the mode selector switch 13 to determine whether it indicates standard pattern data or not in a step S34.

If the speech registration mode is indicated, control then goes to a step S35 in which the controller 16 outputs a command to instruct the speech recognition circuit 15B to carry out a speech registration process. At the same time, the controller 16 sends a registration buffer number to the speech recognition circuit 15B in the step S35.

The speech recognition circuit 15B then stores speech recognition standard pattern data in a corresponding registration buffer for the speech recognition processor in question in the memory 23B, i.e., a registration buffer having the registration buffer number=1, in a step S36.

The controller 16 reads a status register (not shown) in the speech recognition circuit 15B to determine whether the registration of a voice command is finished or not in a step S37. If the registration is not yet finished, then the steps S36 and S37 are repeated until the registration is finished. If the registration is finished, the registration buffer number is incremented by 1 in a step S38.

Then, the controller 16 determines whether or not the current registration buffer number has exceeded a maximum number Nmax that can be registered for the speech recognition processor in question, in a step S39. If not, then control returns to the step S32. If exceeded, the controller 16 determines whether the processor number has exceeded a maximum speech recognition processor number Pmax or not in a step S40. If not exceeded, then control proceeds to a step S41.

In the step S41, the controller 16 sets the registration buffer number to 1 again. Thereafter, the processor number is incremented by 1, and the speech recognition processor corresponding to the processor number, e.g., the speech recognition processor 22-2, is enabled in a step S42.

If the processor number has exceeded the maximum speech recognition processor number Pmax in the step S40, the controller 16 sends a command to cancel the speech registration mode to the speech recognition circuit 15B, thereby canceling the speech registration mode in a step S43. Then, control goes back to the step S32.

If the speech recognition mode is indicated by the mode selector switch 13 in the step S34, then the controller 16 enables all the speech recognition processors in a step S44. Then, the controller 16 outputs a speech recognition command to the speech recognition circuit 15B in a step S45. The speech recognition processors 22-1 through 22-n in the speech recognition circuit 15B now effect a speech recognition process as described above in a step S46.

The controller 16 reads a status register (not shown) in the speech recognition circuit 15B to determine whether the speech recognition by the speech recognition processors 22-1 through 22-n is finished or not in a step S47. If the speech recognition is not yet finished, then the steps S46 and S47 are repeated until the speech recognition is finished. If the speech recognition is finished, then the controller 16 counts the number of speech recognition processors whose recognition results coincide in a step S48. Then, the controller 16 determines whether the number of speech recognition processors whose recognition results do not coincide is 1 or not in a step S49. If the number is 1, then the learning unit 19B updates or replaces the standard pattern data used by that speech recognition processor with the pattern data of the input voice command in a step S50. Since the standard pattern data used by a particular speech recognition processor are automatically updated by the learning unit 19B, the speech recognition rate can be maintained at a constant level over a long period of time.

If the number of speech recognition processors whose recognition results do not coincide is two or more, or the recognition results of all the speech recognition processors coincide, in the step S49, then the controller 16 determines whether the number of speech recognition processors whose recognition results coincide is half or more of the entire number or not in a step S51. If the recognition results of half or more of speech recognition processors coincide, then control goes to a step S52. If the number of speech recognition processors whose recognition results coincide is less than half the entire number, then the controller 16 effects an error process such as the generation of a buzzer sound in a step S54, and control goes back to the step S32.

If the recognition results of half or more of the speech recognition processors coincide in the step S51, then the controller 16 produces a remote control instruction signal SR based on the recognized voice command data and sends the remote control instruction signal SR to the transmitting circuit 17 in the step S52. In response to the remote control instruction signal SR, the transmitting circuit 17 transmits a corresponding remote control signal RC in a step S53. Then, control goes back to the step S32.

In the second embodiment, an input voice command is recognized by a plurality of speech recognition processors 22-1 through 22-n based on their respective standard pattern data PA1 through PM1, PA2 through PM2, ... PAn through PMn. If there is one speech recognition processor whose recognition result does not coincide, then the standard pattern data used by that speech recognition processor are updated or replaced with the pattern data of the input voice command by the learning unit 19B.

Even if the voice of the operator slightly has varied with time after the standard pattern data were first registered, since the standard pattern data are updated by the learning unit 19B from time to time, the speech recognition rate can be maintained at a constant level over a long period of time. Because speech recognition processes are individually effected by the plural speech recognition processors using respective standard pattern data, input voice commands can be recognized more accurately and the speech recognition rate is increased.

The invention may be embodies in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A voice-operated remote control system comprising:
    a microphone for converting a spoken voice command into an electric signal;
    storage means for storing for said voice command a plurality of sets of different standard pattern data, each set of different standard pattern data being independently representative of said voice command as spoken by at least one speaker;
    speech recognition means for converting the electric signal into pattern data and for comparing the pattern data with the plurality of sets of different standard pattern data to recognize one of the sets of the different standard pattern data as corresponding to the spoken voice command; and
    transmitting means for generating and transmitting a remote control signal based on the recognized spoken voice command.

2. A voice-operated remote control system according to claim 1, further comprising a learning unit for automatically updating the stored standard pattern data in response to a change in pattern data of a newly entered voice command.

3. A voice-operated remote control system comprising:
    a microphone for converting a spoken voice command into an electric signal;
    means for converting the electric signal into pattern data;
    a plurality of parallel speech recognition processors for independently evaluating the spoken voice command based on respective stored sets of different standard pattern data, each set of different standard pattern data being independently representative of said voice command as spoken by at least one speaker, and outputting respective recognition results;
    means for selecting one of said recognition results to produce command data corresponding to the spoken voice command; and
    transmitting means for generating and transmitting a remote control signal based on the spoken voice command.

4. A voice-operated remote control system according to claim 3, further comprising a learning unit for automatically updating the stored standard pattern data in response to a change in pattern data of a newly entered voice command.

5. A voice operated remote control system according to claim 3, wherein said stored sets of different standard pattern data of said parallel speech recognition processors include data for a plurality of different voice commands.

* * * * *